United States Patent
Wu et al.

(10) Patent No.: US 7,205,189 B2
(45) Date of Patent: Apr. 17, 2007

(54) METHOD OF MANUFACTURING A DUAL BIT FLASH MEMORY

(75) Inventors: Sheng Wu, Hsinchu (TW); Da Sung, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 181 days.

(21) Appl. No.: 10/710,672

(22) Filed: Jul. 28, 2004

(65) Prior Publication Data
US 2005/0227434 A1    Oct. 13, 2005

(30) Foreign Application Priority Data
Apr. 13, 2004    (TW)    ................. 93110186 A

(51) Int. Cl.
  *H01L 21/8238*  (2006.01)
(52) U.S. Cl. ....................................... 438/211; 438/264
(58) Field of Classification Search ................ 438/201, 438/211, 257, 263–264, 593
See application file for complete search history.

(56) References Cited

U.S. PATENT DOCUMENTS

| 5,714,412 | A  | * | 2/1998  | Liang et al. ................. 438/266 |
| 6,734,055 | B1 | * | 5/2004  | Lin et al. .................... 438/201 |
| 2003/0235951 | A1 | * | 12/2003 | Hashimoto .................. 438/257 |
| 2004/0119109 | A1 | * | 6/2004  | Kang ......................... 257/315 |

* cited by examiner

*Primary Examiner*—Thanhha S. Pham
(74) *Attorney, Agent, or Firm*—Jianq Chyun IP Office

(57) ABSTRACT

A method of manufacturing a non-volatile memory cell is described. The method includes forming a first dielectric layer on a substrate and then forming a patterned mask layer with a trench on the first dielectric layer. A pair of charge storage spacers is formed on the sidewalls of the trench. The patterned mask layer is removed and then a second dielectric is formed on the substrate covering the pair of charge storage spacers. A conductive layer is formed on the second dielectric layer and subsequently patterned to form a gate structure on the pair of charge storage spacers. Portions of the second and first dielectric layers outside the gate structure are removed and then a source/drain region is formed in the substrate on each side of the conductive gate structure.

6 Claims, 8 Drawing Sheets

METHOD OF MANUFACTURING A DUAL BIT FLASH MEMORY

CROSS REFERENCE TO RELATED APPLICATIONS

This application claims the priority benefit of Taiwan application serial no. 93110186, filed Apr. 13, 2004.

BACKGROUND OF INVENTION

1. Field of the Invention

The present invention relates to a method of manufacturing a non-volatile memory cell. More particularly, the present invention relates to a method of manufacturing a one-cell-two-bit type of non-volatile memory cell having applications in both flash memory and silicon-oxide-nitride-oxide-silicon (SONOS) memory.

2. Description of the Related Art

With the rapid increase in the demands for portable electronic products, the need for non-volatile memory grows substantially. Electrically erasable programmable read-only-memory (EEPROM) is a type of non-volatile memory device that allows multiple data writing, reading and erasing operations. Because the stored data will be retained even after power to the device is removed, EEPROM has been broadly applied in personal computer and electronic equipment.

In recent years, flash memory is one of most popular non-volatile memory devices in the market because of the maturity of fabricating techniques and low production cost. In general, a flash memory cell is formed by sequentially forming a tunneling oxide layer, a conductive layer and a dielectric layer over a substrate. Thereafter, the aforementioned layers are patterned to form a floating gate and an inter-gate dielectric layer. Finally, a control gate is formed on the inter-gate dielectric layer above the floating gate.

However, if the tunneling oxide layer underneath the polysilicon floating gate contains some defects, a leakage current may form leading to a drop in the reliability of the device. To resolve this problem, a charge-trapping layer often takes the place of the conventional flo ating gate in the memory. Since the charge-trapping layer is typically a silicon nitride layer, the non-volatile memory cell having an oxide-nitride-oxide (ONO) composite structure is often referred to as a silicon-oxide-nitride-oxide-silicon (SONOS) memory.

Because the silicon nitride layer has the capacity to trap electric charges, electrons injected into the silicon nitride layer will not distribute evenly. Instead, most injected electrons will concentrate in one particular region within the silicon nitride layer. Therefore, in programming a SONOS memory, most of the electrons gather in a local region within the channel above the source region or the drain region. Hence, by changing the voltage applied to the source/drain region on each side of the gate, electrons can be injected into a single silicon nitride layer to set up two separate groups of electrons or a single group of electrons. Alternatively, all the electrons trapped within the silicon nitride layer can be discharged. In other words, the SONOS memory is a 2 bit per cell type of memory because there are altogether four separate charge storage states in each memory cell.

In the process of programming a conventional 2-bit SONOS memory device, hot electrons injected into the charge-trapping layer are spread out with an electron distribution according to the injection energy. However, as the level of integration continues to increase, the charge storage areas of a two-bit memory cell may be so close together that one will affect the other. Ultimately, the charge distribution curve of separate charge storage areas within the silicon nitride layer of a memory cell may be too seriously close to each other that they join up together and lead to programming errors and major drop in the reliability of the memory device.

SUMMARY OF INVENTION

Accordingly, at least one objective of the present invention is to provide a method of manufacturing a non-volatile memory cell capable of simplifying the fabrication process and reducing the dimension of each 2-bit cell.

At least a second objective of the present invention is to provide a method of manufacturing a flash memory capable of producing 2-bit cells each occupying the same area as a single bit cell without incurring technical development cost or requiring expensive equipment.

At least a third objective of the present invention is to provide a method of manufacturing a silicon-oxide-nitride-oxide-silicon (SONOS) memory capable of preventing a group of electrons on one side of a charge-trapping layer from spreading to another side and resulting in possible programming errors. Furthermore, the method can also facilitate the miniaturization of the SONOS memory.

To achieve these and other advantages and in accordance with the purpose of the invention, as embodied and broadly described herein, the invention provides a method of manufacturing a non-volatile memory. First, a first dielectric layer is formed over a substrate. A patterned mask layer having a trench therein is formed over the first dielectric layer. Thereafter, a pair of charge storage spacers is formed on the sidewalls of the trench and then the patterned mask layer and the first dielectric layer are removed. A second dielectric layer is formed over the substrate covering the charge storage spacers. A conductive layer is formed over the second dielectric layer. The conductive layer is patterned to form a gate structure on the charge storage spacers. The second and first dielectric layer outside the gate structure is removed. Finally, a source/drain region is formed in the substrate on each side of the conductive gate structure.

The present invention also provides a method of manufacturing a flash memory. First, a tunneling oxide layer is formed over a substrate. A patterned mask layer having a trench therein is formed over the tunneling oxide layer. Thereafter, a conductive layer is formed over the substrate covering the surface of the trench and then the conductive layer is etched back to form a pair of gate spacers on the sidewalls of the trench. The pair of gate spacers serves as a floating gate. After removing the patterned mask layer, an inter-gate dielectric layer is formed over the substrate covering the gate spacers and the tunneling oxide layer. A control gate is formed on the inter-gate dielectric layer to correspond with the gate spacers. A dielectric spacer is formed on the sidewalls of the control gate while exposing the inter-gate dielectric layer. The exposed inter-gate dielectric layer and tunneling oxide layer are removed. Finally, a source/drain region is formed in the substrate on each side of the control gate.

The present invention also provides a method of manufacturing a silicon-oxide-nitride-oxide-silicon (SONOS) memory. First, a bottom silicon oxide layer is formed over a substrate. A patterned mask layer having a trench therein is formed over the bottom silicon oxide layer. Thereafter, a charge-trapping layer is formed over the substrate covering the surface of the trench. The charge-trapping layer is etched back to form a pair of charge storage spacers on the sidewalls of the trench. After removing the mask layer, a top silicon oxide layer is formed over the substrate covering the charge storage spacers and the bottom silicon oxide layer. A gate corresponding to the pair of charge storage spacers is formed on the top silicon oxide layer. Finally, a source/drain region is formed in the substrate on each side of the gate.

In the present invention, a pair of charge storage structures is formed within each memory cell as spacers. Hence, the manufacturing process is simplified and the area occupied by each non-volatile memory cell is reduced. Furthermore, using the conventional method such as the one used for fabricating a flash memory or SONOS memory, the electrons trapped on one side of the charge-trapping layer within the memory are prevented from spreading to another side and resulting in possible programming errors or a drop in reliability. The method of fabrication according to the present invention also facilitates the miniaturization of SONOS memory cells. Moreover, existing production equipment and current fabrication techniques can be directly deployed. In other words, each 2-bit cell occupies the same area as a single bit cell without incurring additional technical development cost or requiring expensive equipment.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
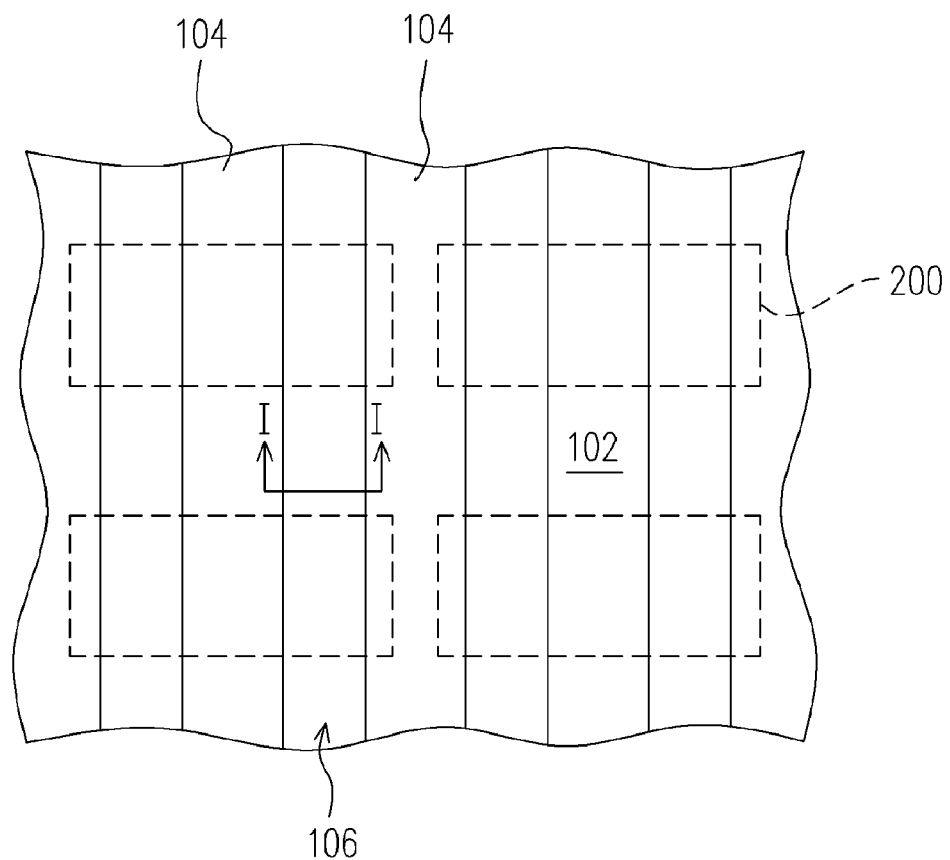
FIGS. 1A through 1D are top views of a portion of the flash memory cells showing the steps for fabricating a flash memory according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

One major design concept of the present invention is to fabricate a pair of spacers within each non-volatile memory cell to serve as a pair of charge storage structures. In the following embodiments, a few applications in non-volatile memories are illustrated. However, this should by no means limits the scope of the present invention as such.

Figure 2A:
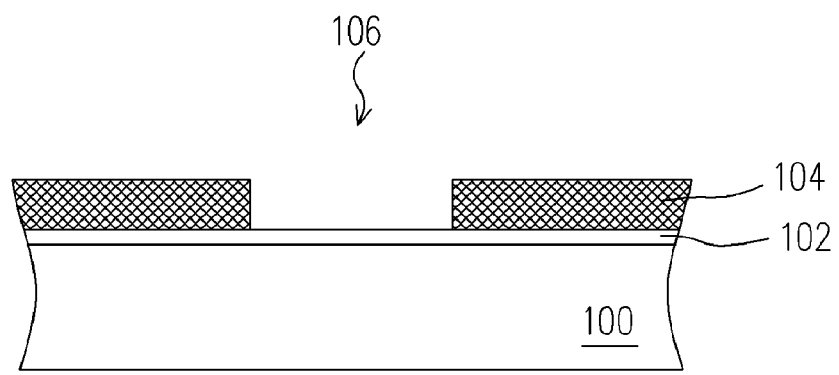
FIGS. 2A through 2G are schematic cross-sectional views showing the steps for fabricating a flash memory according to the first embodiment of the present invention.

FIGS. 1A through 1D are top views of a portion of the flash memory cells showing the steps for fabricating a flash memory according to a first embodiment of the present invention. FIGS. 2A through 2G are schematic cross-sectional views showing the steps for fabricating a flash memory according to the first embodiment of the present invention. As shown in FIGS. 1A and 2A (FIG. 2A is a schematic cross-sectional view along line I—I of FIG. 1A), a tunneling dielectric layer 102 is formed over a substrate 100 having an isolation structure 200 thereon. The tunneling dielectric layer 102 is a silicon oxide layer having a thickness between 7.0 nm to 9.5 nm, for example. Thereafter, a patterned mask layer 104 having a trench 106 therein is formed over the tunneling dielectric layer 102. The patterned mask layer 104 is formed by a material having an etching rate that differs from the material constituting subsequently formed conductive spacers. For example, if the patterned mask layer is a silicon oxynitride (SiON) layer, the silicon oxynitride layer has a thickness between 25 nm to 65 nm and preferably about 45 nm. On the other hand, if the patterned mask layer is a silicon nitride (SiN) layer, the silicon nitride layer has a thickness between 40 nm to 50 nm.

Figure 1B:
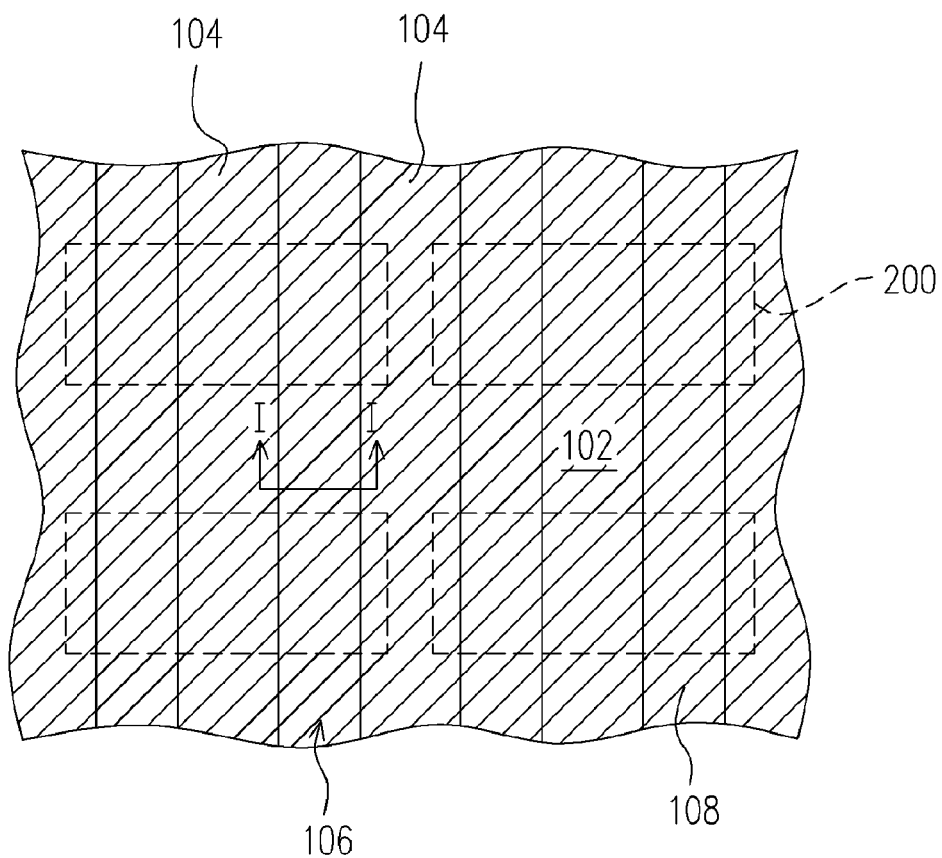
Figure 2B:
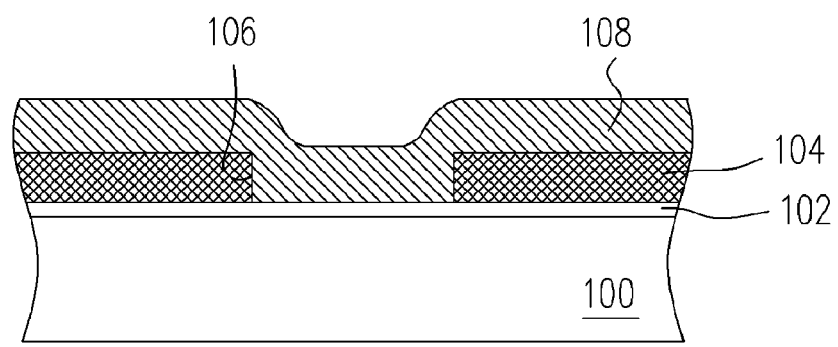

As shown in FIGS. 1B and 2B (FIG. 2B is a cross-sectional view along line I—I of FIG. 1B), a conductive layer 108 is formed over the substrate 100. The conductive layer 108 is, for example, a doped polysilicon layer having a thickness between 20 nm to 60 nm and preferably about 40 nm.

Figure 1C:
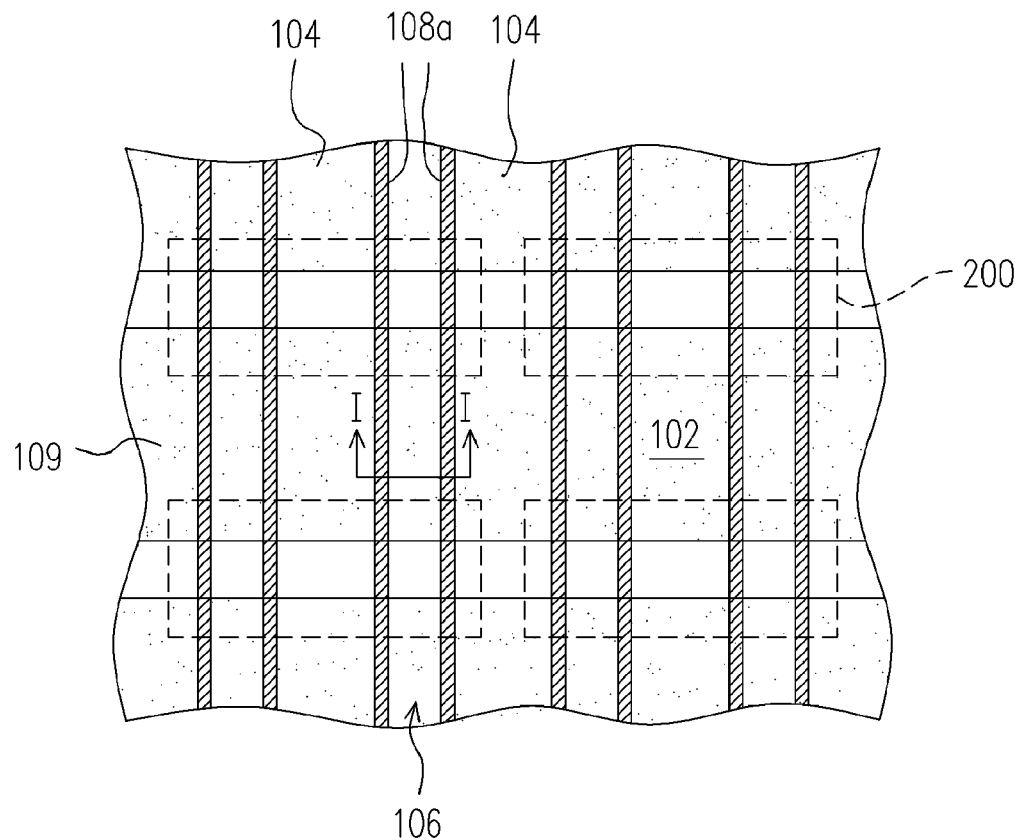
Figure 2C:
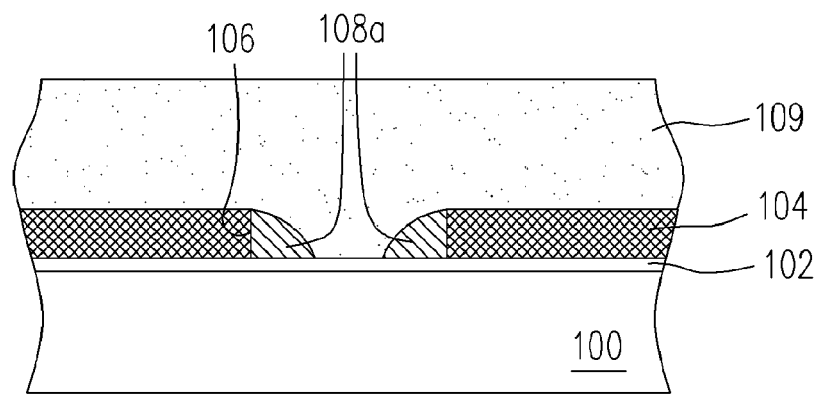

As shown in FIGS. 1C and 2C (FIG. 2C is a cross-sectional view along line I—I of FIG. 1C), the conductive layer 108 is etched back to form a pair of conductive spacers 108a on the sidewalls of the trench 106. Since the trench 106 can be formed to a width equal to the smallest line width in the photolithographic process, the conductive spacers 108a have a dimension even smaller. Consequently, the present invention can utilize existing production equipment and processing technique to fabricate 2-bit flash memory cells. In other words, 2-bit cells each occupying the same area as a single bit cell can be produced without incurring additional technical development cost or requiring expensive equipment. Thereafter, a patterned photoresist layer 109 is formed over the substrate 100 to serve as a mask for patterning the conductive spacers 108a.

Figure 1D:
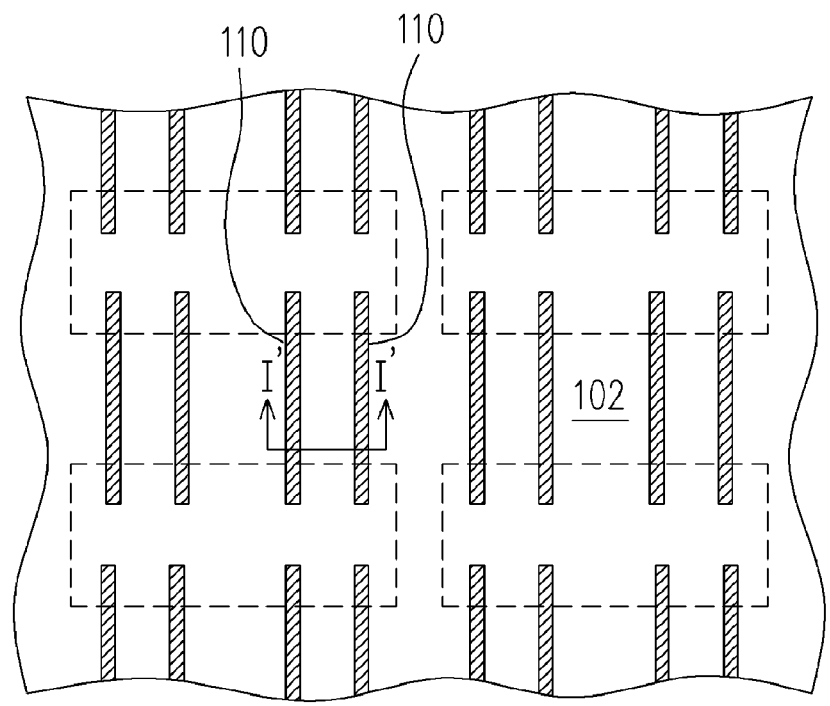
Figure 2D:
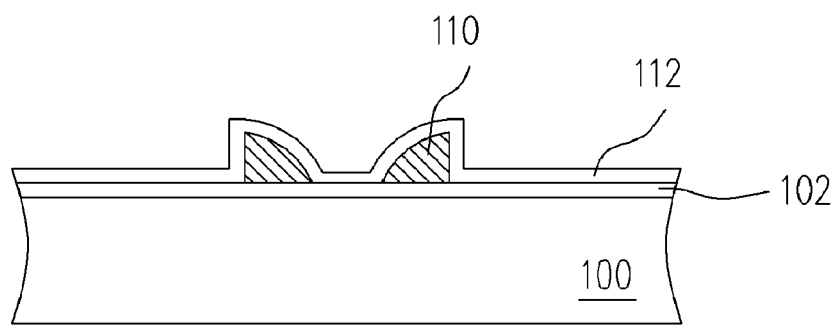

As shown in FIGS. 1D and 2D (FIG. 2D is a cross-sectional view along line I'—I' of FIG. 1D), the conductive spacers 108a are patterned using the patterned photoresist layer 109 (as shown in FIG. 1C) as a mask to form a floating gate 110. Thereafter, the patterned photoresist layer 109 is removed and then the patterned mask layer 104 (as shown in FIG. 1C) is removed. The photoresist layer 109 and the mask layer 104 are removed by wet etching using hot phosphoric acid as the etching solution, for example. An inter-gate dielectric layer 112 is formed over the substrate 100 covering the floating gate 110 and the tunneling dielectric layer 102. The inter-gate dielectric layer 112 is an oxide-nitride-oxide (ONO) composite layer, an oxide-nitride composite layer or an oxide layer, for example.

Figure 2E:
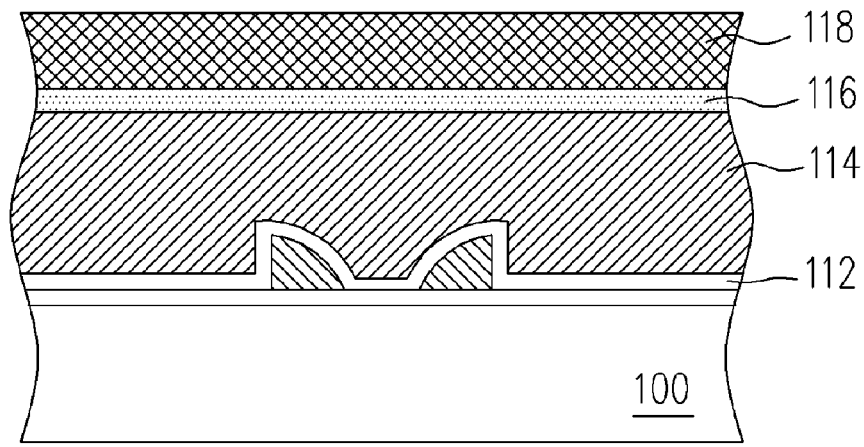

As shown in FIG. 2E, another conductive layer 114 is formed over the inter-gate dielectric layer 112. The conductive layer 114 is a doped polysilicon layer, for example. Thereafter, a silicon oxide layer 116 and a silicon nitride layer 118 are sequentially formed over the conductive layer 114. The oxide layer 116 and the nitride layer 118 together are just an example of a two-layered cap layer and hence should not be construed as a limitation of the present invention. The oxide layer 116 can be a film layer formed, for example, using tetra-ethyl-ortho-silicate (TEOS) as a gaseous reactant.

Figure 2F:
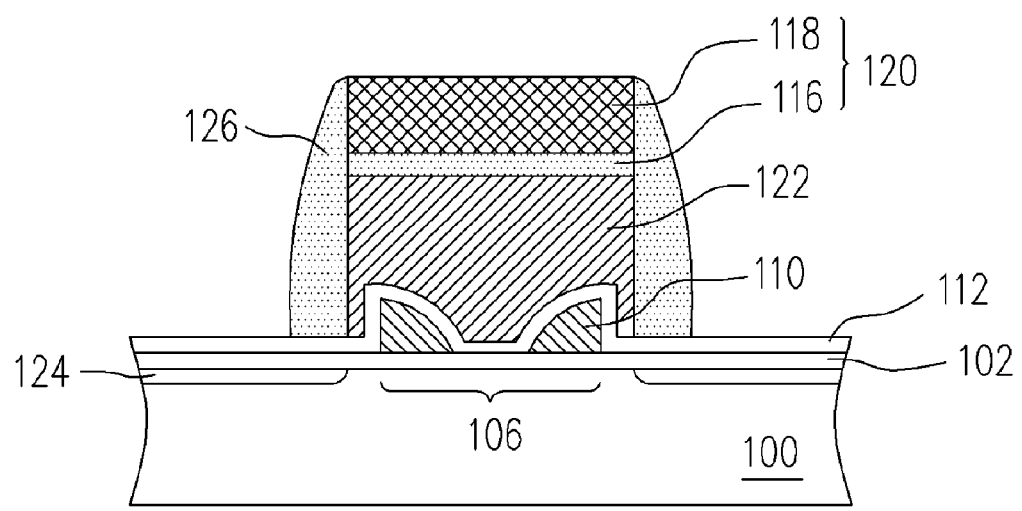

As shown in FIG. 2F, the silicon oxide layer 116 and the silicon nitride layer 118 are patterned to form a cap layer 120. Thereafter, the conductive layer 114 is patterned to form a plurality of control gates 122 that corresponds to the floating gates 110. The control gates 122 are formed with doped polysilicon, for example. Furthermore, in the process of patterning the conductive layer 114, the control gate 122 may be patterned to have a width greater than the width of the trench 106 (shown in the figure) or a width identical to the width of the trench 106. Next, a pair of dielectric spacers 126 is formed on the sidewalls of the control gate 122 and the cap layer 120 while exposing the inter-gate dielectric layer 112.

Figure 2G:
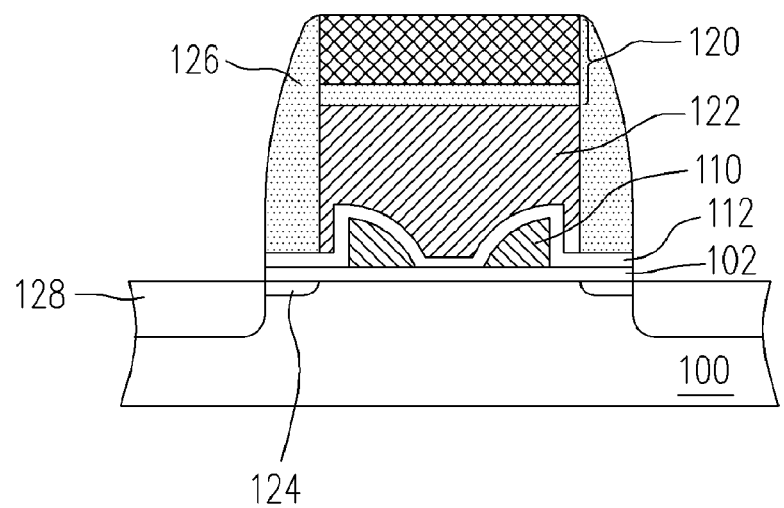

As shown in FIG. 2G, the exposed inter-gate dielectric layer 112 and the underlying tunnel dielectric layer 102 are removed. Thereafter, a source/drain region 128 is formed in the substrate 100 outside the dielectric spacers 126 on each side of the control gate 122.

In the present embodiment, a pair of conductive spacers for holding electric charges is formed within each flash memory cell. Hence, the area occupied by each flash memory cell is reduced. Furthermore, existing production equipment and current fabrication techniques can be directly deployed. In other words, each 2-bit cell occupies the same area as a single bit cell without incurring additional cost for technical development or requiring expensive equipment.

Figure 3A:
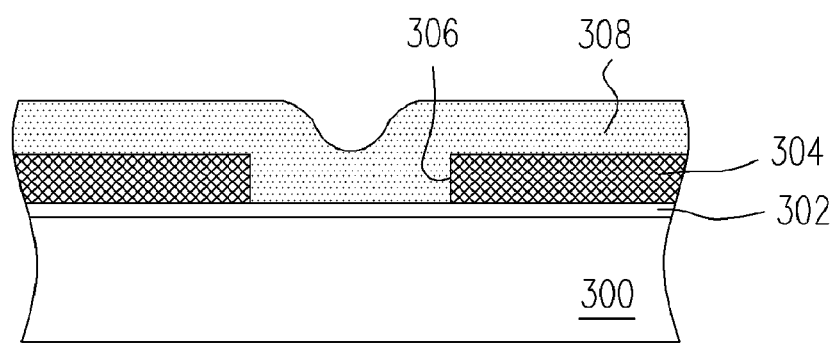
FIGS. 3A through 3E are schematic cross-sectional views showing the steps for fabricating a SONOS memory according to a second embodiment of the present invention.

FIGS. 3A through 3E are schematic cross-sectional views showing the steps for fabricating a SONOS memory according to a second embodiment of the present invention. As shown in FIG. 3A, a bottom silicon oxide layer 302 is formed over a substrate 300. A patterned mask layer 304 is formed over the bottom silicon oxide layer 302. The patterned mask layer 304 has a trench 306 therein. The mask layer 304 is formed with silicon oxynitride or silicon nitride, for example. One major criterion for selecting the material for forming the mask layer 304 is that the etching selectivity must be different from a subsequently formed charge-trapping layer 308. Thereafter, a charge-trapping layer 308 is formed over the substrate 300. The charge-trapping layer 308 can be a silicon nitride layer or a silicon oxynitride layer, for example.

Figure 3B:
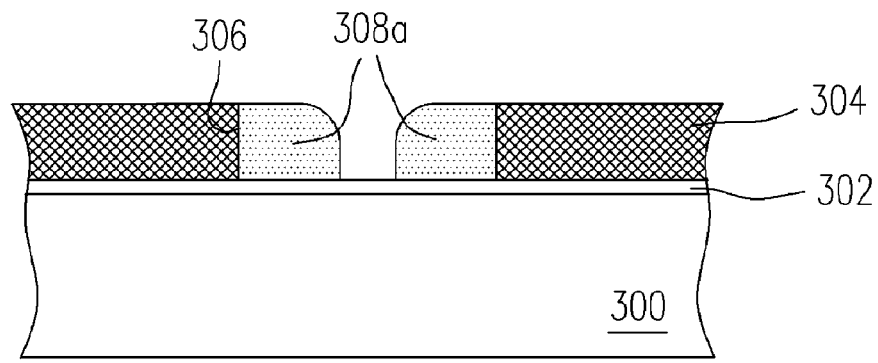

As shown in FIG. 3B, the charge-trapping layer 308 is etched back to form a pair of charge storage spacers 308a on the sidewalls of the trench 306. Since the trench 306 can be formed with the smallest width that can be produced by a photolithographic process, the charge storage spacers 308a within the trench 306 has a dimension even smaller.

Figure 3C:
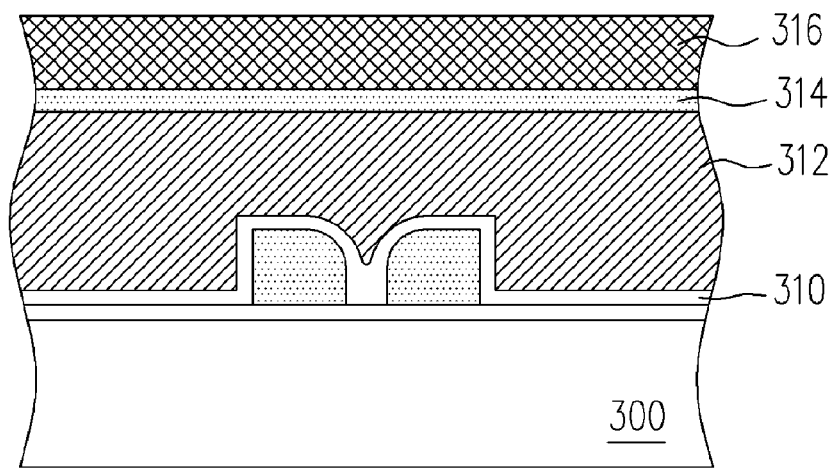

As shown in FIG. 3C, the patterned mask layer 304 is removed, for example, by performing a wet etching operation using hot phosphoric acid as the etching solution. A top silicon oxide layer 310 is formed over the substrate 300 covering the charge-trapping spacers 308 and the bottom silicon oxide layer 302 and then a conductive layer 312 is formed over the top silicon oxide layer 310. Thereafter, a silicon oxide layer 314 and a silicon nitride layer 316 are sequentially formed over the top silicon oxide layer 310 to serve as a cap layer. However, the cap layer including the silicon oxide layer 314 and the silicon nitride layer 316 is just an example and hence should not be used to limit the scope of the present invention.

Figure 3D:
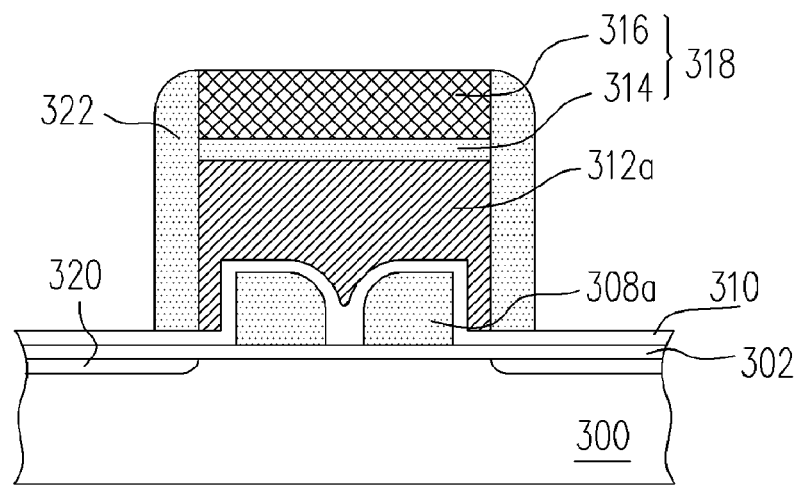

As shown in FIG. 3D, the silicon oxide layer 314 and the silicon nitride layer 316 are patterned to form a cap layer 318. Thereafter, the conductive layer 312 (shown in FIG. 312) is patterned to form a gate 312a on the top silicon oxide layer 310 above the charge-trapping spacers 308a. The gate 312a is formed with doped polysilicon. Furthermore, in the process of patterning the conductive layer 312, the control gate 312a may be patterned to have a width greater than the width of the trench 306 (shown in the figure) or a width identical to the width of the trench 306. A lightly doped region 320 is formed in the exposed region of the substrate 300. A dielectric spacer is formed on the sidewalls of the gate 312a and the cap layer 318 while exposing the top silicon oxide layer 310.

Figure 3E:
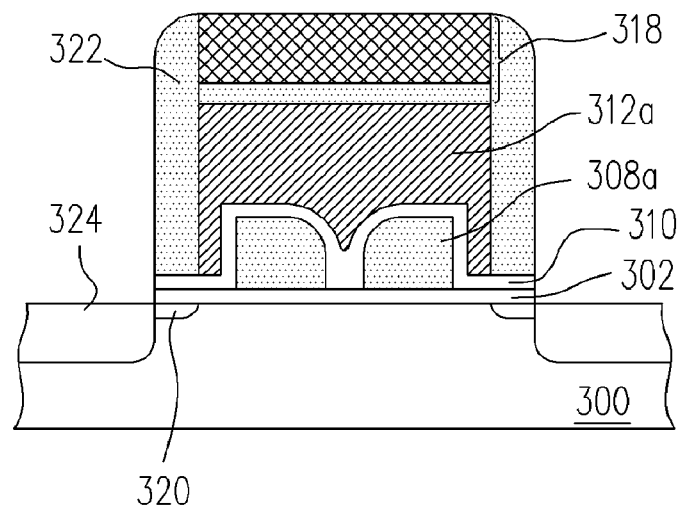

As shown in FIG. 3E, the exposed top silicon oxide layer 310 and the underlying bottom silicon oxide layer 302 are removed. Finally, a source/drain region 324 is formed in the substrate 300 outside the dielectric spacers 322 on each side of the gate 312a.

In summary, major aspects of the present invention at least includes:

1. A pair of charge storage structures is formed within each memory cell as spacers. Hence, the area occupied by each 2-bit memory cell is identical to a conventional single bit cell.
2. Flash memory can be directly fabricated using existing production equipment and current fabrication techniques. Hence, each 2-bit cell not only occupies the same area as a single bit cell, but also incurs no additional technical development cost or requiring expensive equipment.
3. Because the charge storage structure within the SONOS memory are fabricated as spacers, electric charges trapped on one side of the charge-trapping layer is prevented from spreading to another side to result in programming errors. The method of fabrication according to the present invention also facilitates the miniaturization of individual SONOS memory cell.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A method of fabricating a dual bit flash memory, comprising the steps of:
   providing a substrate;
   forming a tunneling dielectric layer over the substrate;
   forming a patterned mask layer over the tunneling dielectric layer, wherein the patterned mask layer has a trench;
   forming a conductive layer over the substrate to cover the surface of the trench;
   removing a portion of the conductive layer to form a pair of conductive spacers on the respective sidewalls of the trench to serve as floating gates;
   removing the patterned mask layer;
   forming an inter-gate dielectric layer over the substrate to cover the floating gates and the tunneling dielectric layer;
   forming a control gate over the inter-gate dielectric layer above the conductive spacers;
   forming a pair of dielectric spacers on the sidewalls of the control gate;
   removing portions of the inter-gate dielectric layer and the tunneling dielectric layer by using the dielectric spacers and the control gate as hard masks; and
   forming source/drain regions in the substrate on each side of the control gate.

2. The method of claim 1, wherein the tunneling dielectric layer comprises a silicon oxide layer.

3. The method of claim 1, wherein the patterned mask layer is a silicon oxynitride layer or a silicon nitride layer.

4. The method of claim 1, wherein the inter-gate dielectric layer is an oxide-nitride-oxide composite layer, an oxide-nitride layer or a silicon oxide layer.

5. The method of claim 1, wherein the conductive layer comprises a doped polysilicon layer.

6. The method of claim 3, wherein the step of removing the patterned mask layer comprises performing a wet etching operation using hot phosphoric acid solution.

* * * * *